(12) United States Patent
Miura-Mattausch et al.

(10) Patent No.: US 8,731,893 B2
(45) Date of Patent: May 20, 2014

(54) CIRCUIT SIMULATION OF MOSFETS

(75) Inventors: Mitiko Miura-Mattausch, Higashihiroshima (JP); Norio Sadachika, Higashihiroshima (JP); Shunta Kusu, Higashihiroshima (JP); Takaki Yoshida, Yokohama (JP)

(73) Assignee: Hiroshima University, a National University Corporation of Japan, Higashihiroshima-shi (JP)

( * ) Notice: Subject to any disclaimer, the term of this patent is extended or adjusted under 35 U.S.C. 154(b) by 182 days.

(21) Appl. No.: 13/080,154

(22) Filed: Apr. 5, 2011

(65) Prior Publication Data

US 2011/0184708 A1 Jul. 28, 2011

Related U.S. Application Data

(63) Continuation of application No. PCT/JP2009/067358, filed on Oct. 5, 2009.

(30) Foreign Application Priority Data

Oct. 6, 2008 (JP) ................................ 2008-259755

(51) Int. Cl.
G06F 17/50 (2006.01)
(52) U.S. Cl.
CPC ................................. *G06F 17/5036* (2013.01)
USPC ............................................... 703/14; 703/2
(58) Field of Classification Search
None
See application file for complete search history.

(56) References Cited

U.S. PATENT DOCUMENTS

| 7,093,214 | B2 * | 8/2006 | Hogyoku | 716/104 |
| 7,685,543 | B2 * | 3/2010 | Tsuji et al. | 703/14 |
| 7,983,889 | B2 * | 7/2011 | Miura et al. | 703/2 |
| 2005/0120315 | A1 * | 6/2005 | Miura et al. | 716/4 |
| 2009/0070084 | A1 * | 3/2009 | Miura et al. | 703/4 |

OTHER PUBLICATIONS

Kitamaru, D. et al. "Complete Surface-Potential-Based Fully-Depleted Silicon-on-Insulator Metal-Oxide-Semiconductor Field-Effect-Transistor Model for Circuit Simulation" Jpn. J. Appl. Phys., vol. 43, No. 4B, pp. 2166-2169 (2004).*

Sadachika, N. et al. "Compact Double-Gate MOSFET Model Correctly Predicting Volume-Inversion Effects" SISPAD, vol. 12, pp. 289-292 (2007).*

Missous, M., Rhoderick, E.H. "A Simple Method of Modelling the C-V Profiles of High-Low Junctions and Heterojunctions" Solid-State Electronics, vol. 28, No. 3, pp. 233-237 (1985).*

(Continued)

*Primary Examiner* — Kandasamy Thangavelu
*Assistant Examiner* — Jay B Hann
(74) *Attorney, Agent, or Firm* — Oblon, Spivak, McClelland, Maier & Neustadt, L.L.P.

(57) ABSTRACT

An arithmetic device calculates the surface potential of a silicon layer by performing computation based on a mathematical expression and device parameters stored in a storage device. Likewise, the arithmetic device calculates the surface potential of a bulk layer under a buried oxide film when the silicon layer is in a partially depleted state and when the silicon is in a fully depleted state. The arithmetic device then performs computation based on the calculated surface potential of the silicon layer, the calculated surface potential of the bulk layer, and mathematical expressions stored in the storage device, and obtains the surface potential of the bulk layer by iterative calculation. The arithmetic device performs computation based on the surface potential of the bulk layer obtained by iterative calculation and mathematical expressions stored in the storage device, and calculates the lower surface potential of the silicon layer.

12 Claims, 9 Drawing Sheets

(56) References Cited

OTHER PUBLICATIONS

Japanese International Search Report mailed Oct. 27, 2009 in PCT/JP2009/067358 filed Oct. 5, 2009 (with English Translation).

Takahiro Murakami et al., "Modeling of Floating-Body Effect in SOI-MOSFET with Complete Surface-Potential Description", The Institute of Electronics, Information and Communication Engineers, IEICE Technical Report, vol. 107, No. 298, SDM2007-212, Oct. 24, 2007, pp. 41-46 with English Abstract.

Norio Sadachika, et al., "Completely Surface-Potential-Based Compact Model of the Fully Depleted SOI-MOSFET Including Short-Channel Effects", IEEE Transactions on Electron Devices, vol. 53, No. 9, Sep. 2006, pp. 2017-2024.

Samuel K. H. Fung., et al., "Present Status and Future Direction of BSIM SOI Model for High-Performance/Low-Power/RF Application", Modeling and Simulation of Microsystems, ISBN 0-9708275-7-1, 2002, pp. 690-693.

Surya Veeraraghavan, et al., "A Physical Short-Channel Model for the Thin-Film SOI MOSFET Applicable to Device and Circuit CAD", IEEE Transactions on Electron Devices, vol. 35, No. 11, Nov. 1988, pp. 1866-1875.

Mitiko Miura-Mattausch, et al., HiSIM2: Advanced MOSFET Model Valid for RF Circuit Simulation, IEEE Transactions on Electron Devices, vol. 53, No. 9, Sep. 2006, pp. 1994-2007.

English translation of the International Preliminary Report on Patentability and Written Opinion issued May 26, 2011 in patent application No. PCT/JP2009/067358 filed Oct. 5, 2009.

Extended European Search Report issued Feb. 15, 2013 in European Patent Application No. 09819167.9.

Takahiro Murakami, et al., "Modeling of Floating-Body Effect in Silicon-on-Insulator Metal-Oxide-Silicon Field-Effect Transistor with Complete Surface-Potential-Based Description", Japanese Journal of Applied Physics, vol. 47, No. 4, XP055052425, 2008, pp. 2556-2559.

Sheng-Lyang Jang, et al., "A Unified Analytical Fully Depleted and Partially Depleted SOI MOSFET Model", IEEE Transactions on Electron Devices, vol. 46, No. 9, XP011017020, Sep. 1999, pp. 1872-1876.

Jeffrey W. Sleight, et al., "A Continuous Compact MOSFET Model for Fully-and Partially-Depleted SOI Devices", IEEE Transactions on Electron Devices, vol. 45, No. 4, XP011016507, Apr. 1998, pp. 821-825 Additional References sheet(s) attached.

\* cited by examiner

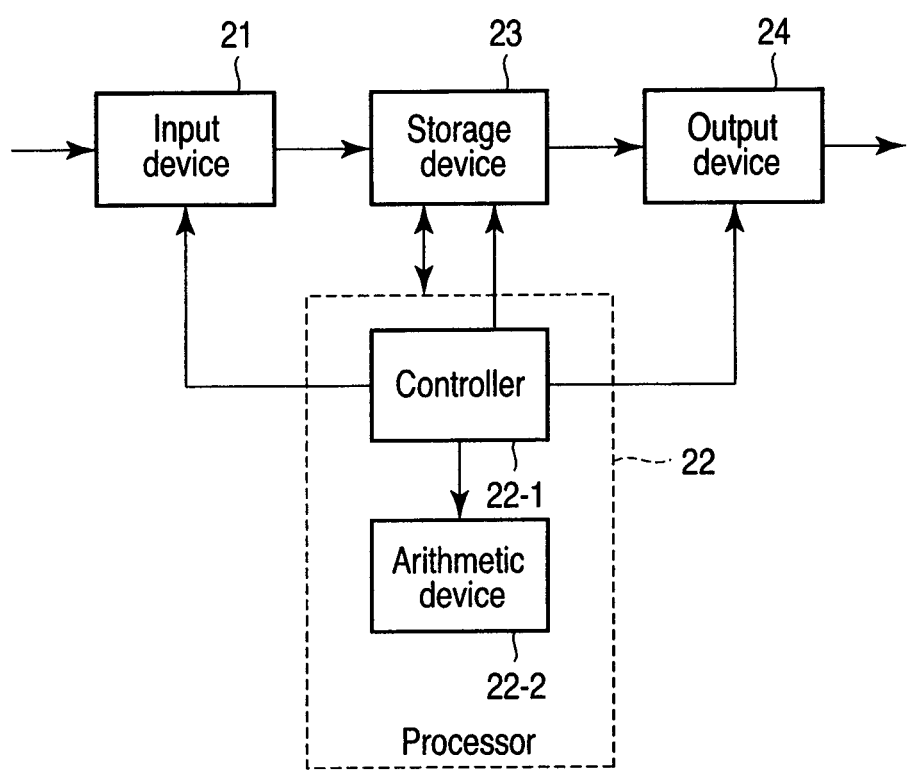
F I G. 3

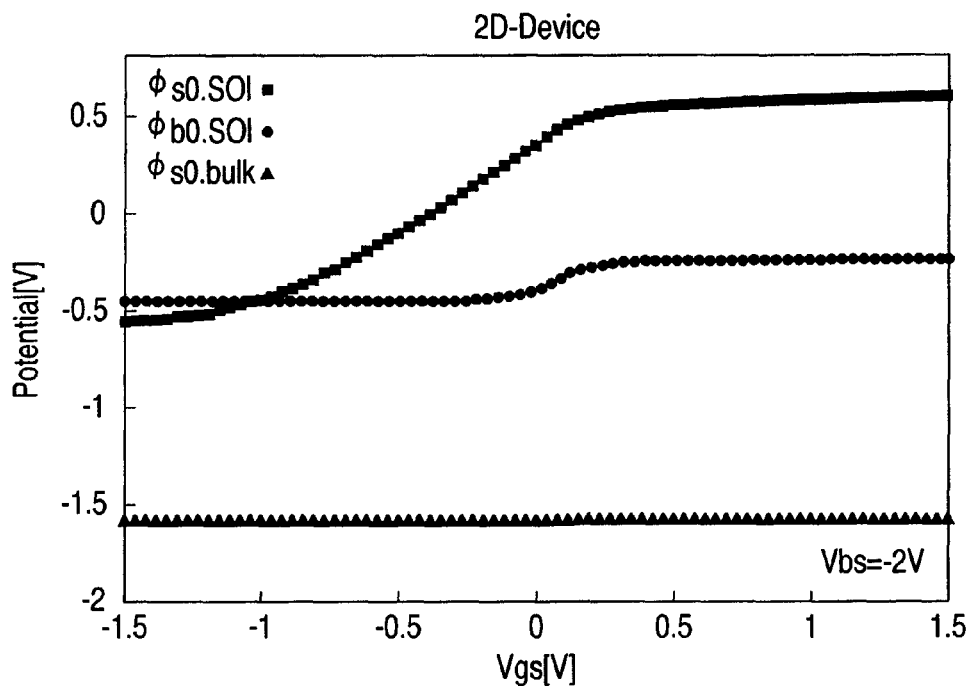
F I G. 6
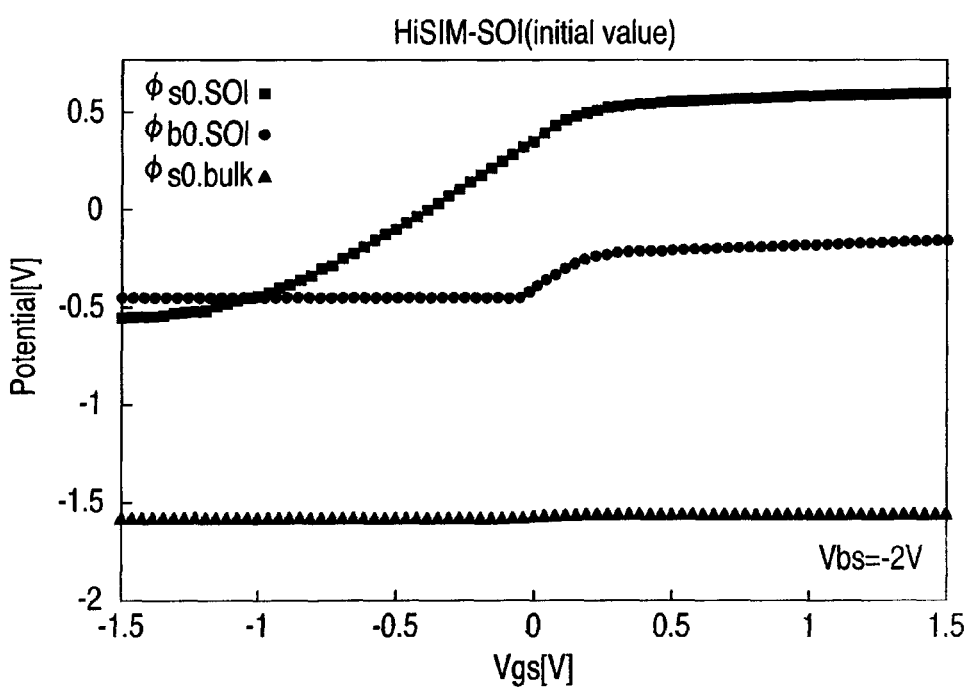
F I G. 7

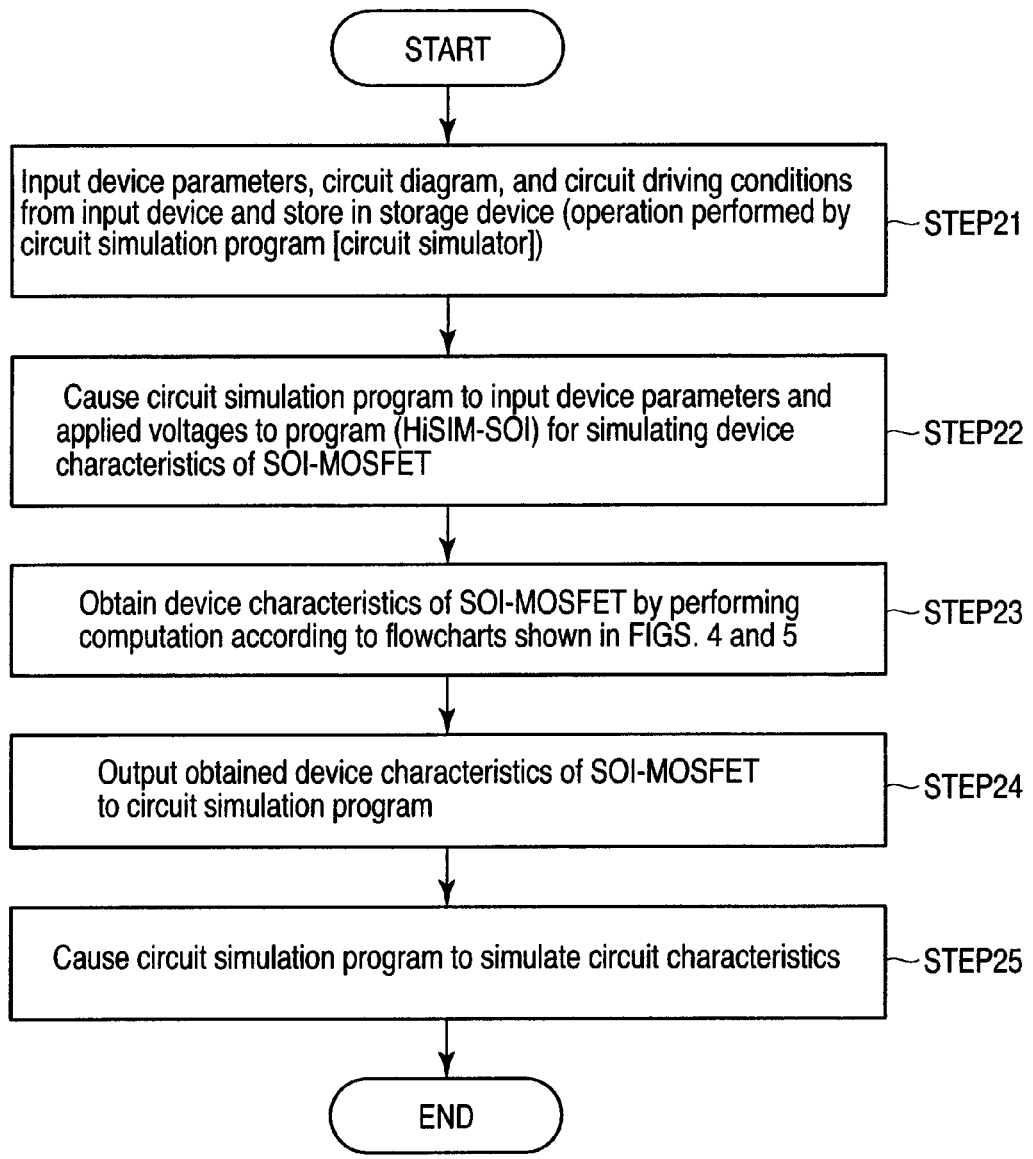
F I G. 11

CIRCUIT SIMULATION OF MOSFETS

CROSS REFERENCE TO RELATED APPLICATIONS

This is a Continuation Application of PCT Application No. PCT/JP2009/067358, filed Oct. 5, 2009, which was published under PCT Article 21(2) in Japanese.

This application is based upon and claims the benefit of priority from prior Japanese Patent Application No. 2008-259755, filed Oct. 6, 2008, the entire contents of which are incorporated herein by reference.

BACKGROUND OF THE INVENTION

1. Field of the Invention

The present invention relates to a simulation method and simulation apparatus which are used for the execution of device design and circuit simulation for SOI-MOSFETs.

2. Description of the Related Art

Recently, with increases in portable devices, demands for high-speed, low-power-consumption devices have increased. As a technique which meets such demands and achieves an increase in the speed of CMOS LSIs and a reduction in power consumption of them, a so-called SOI-MOSFET, which has a MOSFET formed on a silicon-on-insulator (SOI) substrate, has been used.

An SOI-MOSFET is obtained by forming a buried oxide film called a BOX [buried oxide] under a channel region of a bulk-MOSFET (general MOSFET) and forming a channel in a thin silicon layer on the buried oxide film.

In FIGS. 1(a) and (b) respectively show the cross-sectional arrangements of the above bulk-MOSFET and SOI-MOSFET. Referring to (a) and (b) in FIG. 1, reference number 11 denotes a semiconductor substrate (also called a bulk in the case of an SOI-MOSFET); 12, a buried oxide film (BOX); 13, a silicon layer (SOI layer); 14, a source region; 15, a drain region; 16, a channel region; 17, a gate oxide film (FOX: front oxide in the case of an SOI-MOSFET); and 18, a gate electrode.

The SOI-MOSFET is smaller in stray capacitance than the bulk-MOSFET because of the buried oxide film 12 provided under the channel region 16, and hence can reduce switching delay. This can also reduce leakage currents to the semiconductor substrate 11.

Such SOI-MOSFETs are classified into three types according to the thickness of the above silicon layer (SOI layer), namely the fully depleted type, partially depleted type, and non-fully depleted type. In a non-fully depleted SOI-MOSFET, the depletion layer in the SOI layer 13 does not reach the buried oxide film 12 under normal voltage conditions, and the MOSFET exhibits characteristics similar to those of a bulk-MOSFET. In a partially depleted SOI-MOSFET, only the depletion layer at the drain end of the SOI layer 13 reaches the buried oxide film 12 under normal voltage conditions. In a fully depleted SOI-MOSFET, the entire SOI layer 13 is depleted under normal voltage conditions, and the MOSFET exhibits characteristics most different from those of a bulk-MOSFET.

The above fully depleted SOI-MOSFET has the following merits.

(1) Since the silicon layer in which a channel is formed is thin, leakage currents at a deep portion below the gate electrode can be suppressed.

(2) When the SOI layer is in a depleted state, since the gate capacitance is small, the sub-threshold swing is small.

(3) Since the substrate-voltage dependence of the threshold voltage is small, the saturated current is large.

(4) Since an insulator is provided between the source and drain regions (diffusion layer) and the substrate, the junction capacitance is small.

As described above, a fully depleted SOI-MOSFET is a high-speed, low-power-consumption device and is expected to have a wide range of applications. In order to allow circuit design exploiting the merits of such a fully depleted SOI-MOSFET, several circuit simulation models have been developed. Known main models include, for example, the BSIM (Berkely short-channel IGFET model-SOI) described in non-patent document 1 and the University of Florida SOI (UF-SIM) described in non-patent document 2. These models are provided with important characteristics unique to SOI-MOSFETs, e.g., a parasitic bipolar effect and a generation-recombination current. In addition, they are also made in consideration of smooth transition from a partially depleted state to a fully depleted state.

These models, however, have been developed as extensions of bulk-MOSFET models, and hence have not been able to solve the problem of non-convergence in circuit simulations. This problem associated with convergence seems to originate from a violation of the law of conservation of charge.

The Hiroshima University STARC IGFET Model (HiSIM) uses a method of calculating the surface charge by deriving the surface potential using a single expression (diffusion-drift expression) in the operation from weak inversion to strong inversion of a MOSFET, thereby obtaining a current (see, for example, non-patent document 3). The voltage-current characteristic of a MOSFET obtained in this technique allows to reproduce actual measurement values properly with relatively simple calculations. However, since HiSIM is also a bulk-MOSFET model, the application of this technique to an SOI-MOSFET will lead to deterioration in stability and accuracy.

As indicated by the potential chart of FIG. 2, in the SOI-MOSFET, potentials $\phi_{s0.bulk}$, $\phi_{b0.SOI}$, and $\phi_{s0.SOI}$ are respectively generated at an interface BB between the bulk and the BOX, an interface BS between the BOX and the SOI layer, and an interface SF between the SOI layer and the FOX. Referring to FIG. 2, reference symbol $Q_{bulk}$ denotes charge in the bulk per unit area; $Q_{SOI}$, charge in the SOI layer per unit area; $\phi_{SOI}$, a potential change at the SOI layer; $V_{gs}$, a gate-source voltage; and $V_{fb}$, a flat-band voltage.

Potentials $\phi_{s0.bulk}$, $\phi_{b0.SOI}$, and $\phi_{s0.SOI}$ described above become factors that cause variation in surface potentials at the source and drain region ends which are used by a bulk-MOSFET model of HiSIM, leading to deterioration in stability and accuracy. Demands have arisen for a simulation method and simulation apparatus which can extend HiSIM into a model capable of covering an SOI-MOSFET structure and perform stable, accurate simulation.

CITATION LIST

Non Patent Document

Non-patent document 1: Samuel K. H. Fung, Pin Su, and Chenming Hu, "Present Status and Future Direction of BSIM SOI Model for High-Performance/Low-Power/RF Application" in proc. Model. Simul. Microsysst, 2002, pp. 690-693.

Non-patent document 2: S. Veeratoghavan and J. G. Fogsum, "A physical short-channel model for the thin-film SOI MOSFET applicable to the device and circuit CAD." IEEE Trans. Electron Devices, Vol. 35. No. 11, pp. 1866-1875, November 1988.

Non-patent document 3: M. Miura-Mattausch, N. Sadachika, D. Navarro, G. Suzuki, Y. Takeda, M. Miyake, T. Warabino, Y. Mizukane, R. Inagaki, T. Ezaki, H. J. Mattausch, T. Ohguro, T. Lizuka, M. Taguchi, S. Kumashiro, and S. Miyamoto, "HiSIM2: Advanced MOSFET Model Valid for RF Circuit Simulation," IEEE Trans. Electron Devices, Vol. 53, p. 1994. 2006.

BRIEF SUMMARY OF THE INVENTION

The present invention provides a simulation method and simulation apparatus which can simulate the device characteristics of an SOI-MOSFET stably and accurately.

According to one aspect of the present invention, there is provided a simulation method of simulating device characteristics of a transistor in which a source region and a drain region are isolated and formed in a silicon layer on a buried oxide film, and a gate electrode is formed on a gate insulating film on a channel region between the source region and the drain region, characterized by comprising the steps of inputting a mathematical expression as one form of expression of data representing a characteristic of the transistor using an input device and causing a storage device to store the mathematical expression, inputting a device parameter for the transistor from the input device and causing the storage device to store the device parameter, calculating a first value of a surface potential of the silicon layer by performing computation using an arithmetic device based on the mathematical expression and the device parameter stored in the storage device, calculating a first value of a surface potential of a bulk layer under the buried oxide film when the silicon layer is in a partially depleted state and when the silicon layer is in a fully depleted state, by causing the arithmetic device to perform computation based on the mathematical expression and the device parameter stored in the storage device, causing the arithmetic device to perform computation based on the calculated first value of the surface potential of the silicon layer, the calculated first value of the surface potential of the bulk layer, and the mathematical expression stored in the storage device, and obtaining a second value of the surface potential of the bulk layer by iterative calculation, and calculating a first value of a lower surface potential of the silicon layer by causing the arithmetic device to perform computation based on the second value of the surface potential of the bulk layer obtained by the iterative calculation and the mathematical expression stored in the storage device.

In addition, there is provided a simulation apparatus which simulates the device characteristics of a transistor by executing each step in the above simulation method.

BRIEF DESCRIPTION OF THE SEVERAL VIEWS OF THE DRAWING

FIG. 3 is a block diagram showing the schematic arrangement of a simulation apparatus according to the first embodiment of the present invention;

FIG. 6 is a graph showing the relationship between the surface potential of the SOI layer, the rear surface potential of the SOI layer, and the surface potential of the bulk layer and the gate-source voltage in a two-dimensional device simulator (2D-Device) model;

FIG. 7 is a graph showing the relationship between the surface potential of the SOI layer, the rear surface potential of the SOI layer, and the surface potential of the bulk layer and the gate-source voltage in an HiSIM-SOI (initial value) model;

FIG. 11 is a flowchart for obtaining device characteristics according to the third embodiment.

DETAILED DESCRIPTION OF THE INVENTION

Figure 1:
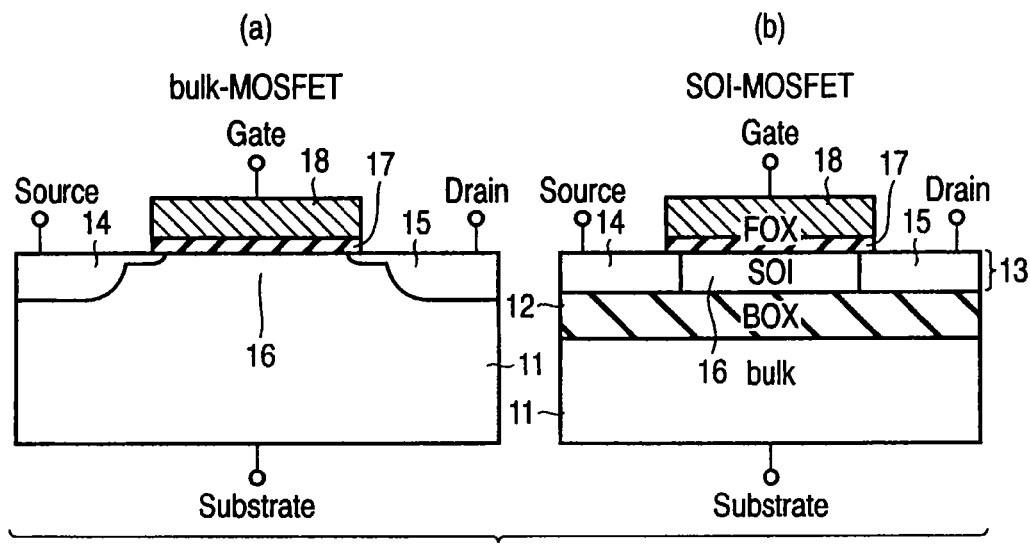
FIG. 1 schematically shows the cross-sectional arrangements of a bulk-MOSFET and SOI-MOSFET.
Figure 2:
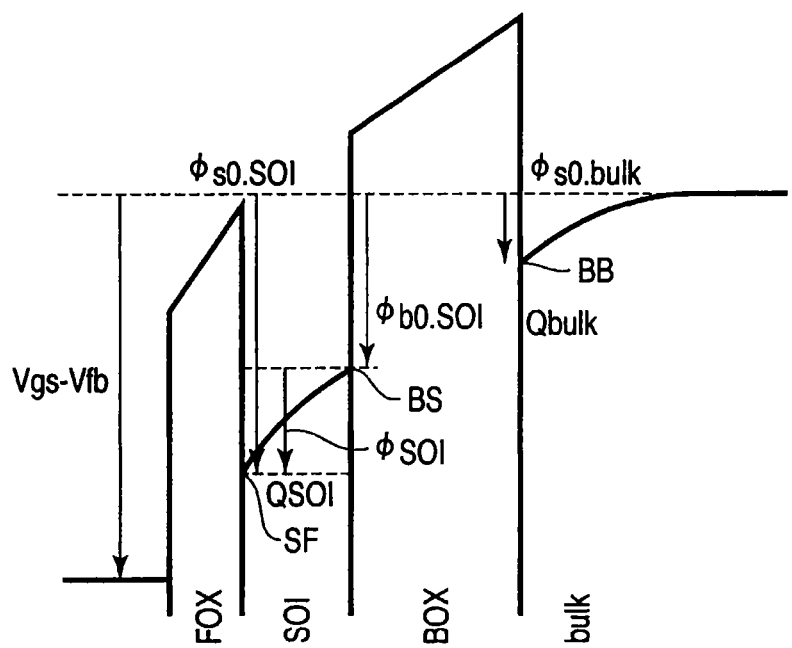
FIG. 2 is a view for explaining potentials on an SOI-MOSFET.

The embodiments of the present invention will be described below with reference to the views of the accompanying drawing.

An outline of an SOI-MOSFET model used in the present invention and the process of consideration leading to this model will be described first. A simulation method and simulation apparatus according to an embodiment using this SOI-MOSFET model will then be described.

The following is a basic idea of the present invention.

As described above, in an SOI-MOSFET, potentials exist at an interface BB between the bulk and the BOX, an interface BS between the BOX and the SOI layer, and an interface SF between the SOI layer and the FOX. A Poisson equation can relate these three surface potentials. In order to obtain the three surface potentials, three equations are required. These potentials change depending on the structure of an SOI-MOSFET.

The structure of an SOI-MOSFET has a high degree of freedom. In order to optimize the structure of the SOI-MOSFET, it is necessary to stably solve this equation for all structures. This is because a potential distribution determines device characteristics. It is, however, not easy to stably solve the Poisson equation by iterative calculation.

For this reason, stable solutions are always obtained by using two methods, namely (i) deriving initial solutions, and (ii) solving by using Jacobian (Newton method).

In order to derive initial solutions, the equations for the three surface potentials are independently solved. A surface potential $\phi_{s0\_SOI}$ of the SOI layer and a lower surface potential $\phi_{b0\_SOI}$ of the SOI layer are obtained by analysis formulae, and a surface potential $\phi_{s0\_bulk}$ of the bulk layer is accurately obtained by using iterative calculation. In this iterative calculation, for example, a Newton method in one variable is used.

An initial solution derivation procedure includes steps (a) to (d) described below.

(a) The initial solution (analysis formula) of HiSIM2 which is a bulk-MOSFET model is used as the initial solution of surface potential $\phi_{s0.SOI}$ of the SOI layer.

(b) It is determined whether the SOI layer is in a partially depleted (PD) state or a fully depleted (FD) state. The analytic solution of surface potential $\phi_{s0.bulk}$ of the bulk layer is then derived in each state. This analytic solution is used as the initial solution of iterative calculation in step (c).

(c) Surface potential $\phi_{s0.bulk}$ of the bulk layer is then obtained by iterative calculation using the initial solution of surface potential $\phi_{s0.SOI}$ of the SOI layer obtained in step (a) and the initial solution of surface potential $\phi_{s0.bulk}$ of the bulk layer obtained in step (b).

(d) The lower surface potential $\phi_{b0.SOI}$ of the SOI layer is obtained by an analysis formula using surface potential $\phi_{s0.bulk}$ of the bulk layer obtained in step (c).

Calculation of specific initial values will be described in detail next.

An equation for the initial value of surface potential $\phi_{s0.SOI}$ of the SOI layer is derived in the same manner as for the initial value of a surface potential $\phi_{s0}$ at the source end in the channel of HiSIM2 (when bulk-source voltage $V_{bs}=0$ V).

Surface potential $\phi_{s0.bulk}$ of the bulk layer is obtained by solving the Newton method (one variable). The Newton method is solved by using Equation (1) obtained adding the following two Poisson equations for SOI and removing the lower surface potential $\phi_{b0.SOI}$ of the SOI layer.

[Mathematical 1]

$$\phi_{s0\cdot SOI} = \phi_{b0\cdot SOI} - \frac{Q_{s0\cdot bulk} + \frac{1}{2}Q_{dep\cdot SOI}}{C_{SOI}} \quad (1)$$

[Mathematical 2]

$$\phi_{b0\cdot SOI} = \phi_{s0\cdot bulk} - \frac{Q_{s0\cdot bulk}}{C_{BOX}} + V_{bi\cdot SOI} + V_{bs}$$

[Mathematical 3]

$$\phi_{s0\cdot SOI} = \phi_{s0\cdot bulk} - \left(\frac{1}{C_{BOX}} + \frac{1}{C_{SOI}}\right)\cdot Q_{bulk} - \frac{1}{2C_{SOI}}\cdot Q_{dep\cdot SOI} + v_{bi\cdot SOI} + V_{bs}$$

In this case, a capacitance $C_{SOI}$ of the SOI layer and surface potential $\phi_{s0.bulk}$ of the bulk layer are respectively expressed by:

[Mathematical 4]

$$C_{SOI} = \frac{\varepsilon_{Si}}{t_{SOI}}$$

[Mathematical 5]

$$Q_{s0\cdot bulk} = \sqrt{\frac{2q\varepsilon_{Si}N_{sub\cdot bulk}}{\beta}} \left[e^{-\beta\phi_{s0\cdot bulk}} + \beta\phi_{s0\cdot bulk} - 1 + \frac{n_i^2}{N_{sub\cdot bulk}^2}(e^{\beta\phi_{s0\cdot bulk}} - 1)\right]^{\frac{1}{2}}$$

In the above equation, $Q_{s0.bulk}$ is the charge induced in the bulk after the SOI layer is set in the FD state, $Q_{dep.SOI}$ is the depletion charge of the SOI layer, $V_{bi.SOI}$ is the built-in potential between the SOI layer and the bulk layer, $V_{bs}$ is the bulk-source voltage, $C_{BOX}$ is the capacitance of the buried oxide film, $Q_{bulk}$ is the charge in the bulk per unit area, $\varepsilon_{Si}$ is the dielectric constant of silicon, $t_{SOI}$ is the thickness of the SOI layer, q is an elementary charge quantity, $\beta$ is the reciprocal of a thermal voltage, and $N_{sub.bulk}$ is the impurity concentration of the bulk.

Consider, as analytic initial values to be used for the calculation of initial values (one-variable Newton method), values in two cases, i.e., a case (A) in which the bulk is in a depleted state and a case (B) in which the bulk is in an inverted state, upon determining whether the SOI layer is in the (I) FD state or the (II) PD state. That is, consider values in four cases.

It is determined whether the SOI layer is in the FD state or the PD state, as follows. If a depletion layer width $W_{d.SOI}$ of the SOI layer is larger than the thickness $t_{SOI}$ of the SOI layer, it is determined that the SOI layer is in the FD state. If a depletion layer width $W_{d.SOI}$ is smaller than the thickness $t_{SOI}$, it is determined that the SOI layer is in the PD state.

In this case, the depletion layer width $W_{d.SOI}$ can be expressed by

[Mathematical 6]

$$W_{d\cdot SOI} = \sqrt{\frac{2\varepsilon_{Si}\phi_{s0\cdot SOI}}{qN_{sub\cdot SOI}}}$$

Note that $N_{sub.SOI}$ represents the impurity concentration of the SOI layer.

It is determined with reference to the following equation whether the bulk surface is in the depleted state or the inverted state:

[Mathematical 7]

$$2\psi_{B\cdot bulk} = \frac{2}{\beta}\cdot\ln\left(\frac{N_{sub\cdot bulk}}{n_i}\right)$$

$\phi_{s0.bulk} = \phi_{s0.bulk\_iniA}(\phi_{s0.bulk\_iniA} < 2\psi_{B.bulk})$ smoothing $(\phi_{s0.bulk\_iniA} > 2\psi_{B.bulk})$ of $\phi_{s0.bulk} = \phi_{s0.bulk\_iniA}$ and $\phi_{s0.bulk\_iniB}$ where $\phi_{s0.bulk\_iniA}$ is the initial value of the surface potential when the bulk is in the depleted state, $\phi_{s0.bulk\_iniB}$ is the initial value of the surface potential when the bulk is in the inverted state, and $\psi_{B.bulk}$ is the difference between the intrinsic Fermi level and the Fermi level.

<Initial Value Calculation (Analysis Formula)>

(I.A) When SOI Layer is in FD State and Bulk is in Depleted State:

Equation (1) is solved by approximating the charge $Q_{s0.bulk}$ induced in the bulk with the following formula:

[Mathematical 8]

$$Q_{s0\cdot bulk} \simeq \sqrt{\frac{2q\varepsilon_{Si}N_{sub\cdot bulk}}{\beta}}\left[\beta\phi_{s0\cdot bulk} - 1\right]^{\frac{1}{2}}$$

This formula is then transformed into

[Mathematical 9]

$$\phi_{s0\cdot bulk\_FD\_iniA} = \frac{2A_2 + A_1\beta - \sqrt{(2A_2 + A_1\beta)^2 - 4(A_2^2 + A_1)}}{2}$$

Note that $A_1$ and $A_2$ are given by

[Mathematical 10]
$$A_1 = \frac{2q\varepsilon_{Si}N_{sub\text{-}bulk}}{\beta}\left(\frac{1}{C_{BOX}} + \frac{1}{C_{SOI}}\right)^2$$

[Mathematical 11]
$$A_2 = \phi_{s0\text{-}SOI} + \frac{Q_{dep\text{-}SOI}}{2C_{SOI}} - V_{bs} - V_{bi\text{-}SOI}$$

$Q_{dep\text{-}SOI}$ is given by

[Mathematical 12]
$$Q_{dep\text{-}SOI} = -qN_{sub\text{-}SOI}t_{SOI}$$

(I.B) When SOI Layer is in FD State and Bulk is in Inverted State:

Equation (1) is solved by approximating the charge $Q_{s0\text{-}bulk}$ induced in the bulk with the following formula:

[Mathematical 13]
$$Q_{s0\text{-}bulk} \simeq \sqrt{\frac{2q\varepsilon_{Si}N_{sub\text{-}bulk}}{\beta}}\left[\frac{n_i^2}{N_{sub\text{-}bulk}^2}(e^{\beta\phi_{s0\text{-}bulk}} - 1)\right]^{\frac{1}{2}}$$

$\phi_{s0\text{-}bulk\_FD\_iniB}$ is given by

[Mathematical 14]
$$\phi_{s0\text{-}bulk\_FD\_iniB} = \frac{\ln\left(\frac{A_4^2}{A_3} \cdot \frac{N_{sub\text{-}bulk}}{n_i^2}\right)}{\beta + \frac{2}{A_4}}$$

Note that $A_3$ and $A_4$ are given by

[Mathematical 15]
$$A_3 = \frac{2q\varepsilon_{Si}N_{sub\text{-}bulk}}{\beta}\left(\frac{1}{C_{BOX}} + \frac{1}{C_{SOI}}\right)^2$$

[Mathematical 16]
$$A_4 = \phi_{s0\text{-}SOI} + \frac{Q_{dep\text{-}SOI}}{2C_{SOI}} - V_{bs} - V_{bi\text{-}SOI}$$

In this case, $n_i$ is the intrinsic carrier density.

(II.A) When SOI Layer is in PD State and Bulk is in Depleted State:

When the SOI layer is in the PD state, as surface potential $\phi_{s0\text{-}SOI}$ of the SOI layer increases, the depletion layer expands to hold the following relationship:

[Mathematical 17]
$$\phi_{s0\text{-}SOI} = -\frac{qN_{sub\text{-}SOI}}{2\varepsilon_{Si}} \cdot W_{d\text{-}SOI}^2$$

When $W_{d\text{-}SOI} = t_{SOI}$, it is assumed that Equation (1) holds as well as the above relationship. For this reason, Equation (1) yields Equation (2):

[Mathematical 18]
$$\phi_{s0\text{-}bulk} - \left(\frac{1}{C_{BOX}} + \frac{1}{C_{SOI}}\right) \cdot Q_{bulk} + V_{bi\text{-}SOI} + V_{bs} = 0 \quad (2)$$

Equation (2) is solved by approximation with the following formula as in the case in which the SOI layer is in the FD state:

[Mathematical 19]
$$Q_{s0\text{-}bulk} \simeq \sqrt{\frac{2q\varepsilon_{Si}N_{sub\text{-}bulk}}{\beta}}[\beta\phi_{s0\text{-}bulk} - 1]^{\frac{1}{2}}$$

Equation (2) then yields

[Mathematical 20]
$$\phi_{s0\text{-}bulk\_PD\_iniA} = \frac{2A_6 + A_5\beta - \sqrt{(2A_6 + A_5\beta)^2 - 4(A_6^2 + A_5)}}{2}$$

Note that $A_5$ and $A_6$ are respectively given by

[Mathematical 21]
$$A_5 = \frac{2q\varepsilon_{Si}N_{sub\text{-}bulk}}{\beta}\left(\frac{1}{C_{BOX}} + \frac{1}{C_{SOI}}\right)^2$$
$$A_6 = -V_{bs} - V_{bi\text{-}SOI}$$

(II.B) When SOI Layer is in PD State and Bulk is in Inverted State:

Equation (2) is solved by approximation with the following formula:

[Mathematical 22]
$$Q_{s0\text{-}bulk} \simeq \sqrt{\frac{2q\varepsilon_{Si}N_{sub\text{-}bulk}}{\beta}}\left[\frac{n_i^2}{N_{sub\text{-}bulk}^2}(e^{\beta\phi_{s0\text{-}bulk}} - 1)\right]^{\frac{1}{2}}$$

Equation (2) then yields

[Mathematical 23]
$$\phi_{s0\text{-}bulk\_PD\_iniB} = \frac{\ln\left(\frac{A_8^2}{A_7} \cdot \frac{N_{sub\text{-}bulk}^2}{n_i^2}\right)}{\beta + \frac{2}{A_8}}$$

Note that $A_7$ and $A_8$ are respectively given by

[Mathematical 24]
$$A_7 = \frac{2q\varepsilon_{Si}N_{sub\text{-}bulk}}{\beta}\left(\frac{1}{C_{BOX}} + \frac{1}{C_{SOI}}\right)^2$$
$$A_8 = -V_{bs} - V_{bi\text{-}SOI}$$

<Initial Value Calculation (One-Variable Newton Method)>
(2.1) In Case of FD State Surface potential $\phi_{s0.bulk}$ of the bulk layer is updated by the Newton method while f($\phi_{s0.bulk}$) is expressed by the following equation according to Equation (1).

$$f(\phi_{s0.bulk}) = \qquad \text{[Mathematical 25]}$$
$$\phi_{s0.SOI} - \phi_{s0.bulk} + \left(\frac{1}{C_{BOX}} + \frac{1}{C_{SOI}}\right) \cdot Q_{bulk} + \frac{1}{2C_{SOI}} \cdot Q_{dep.SOI} - V_{bi.SOI} - V_{bs}$$

Then, $\phi_{s0.bulk}^{n+1}$ is given by $$\phi_{s0.bulk}^{n+1} = \phi_{s0.bulk}^{n} - \frac{f(\phi_{s0.bulk}^{n})}{f'(\phi_{s0.bulk}^{n})} \qquad \text{[Mathematical 26]}$$

(2.2) In Case of PD State

Surface potential $\phi_{s0.bulk}$ of the bulk layer is updated by the Newton method while f($\phi_{s0.bulk}$) is expressed by the following equation according to Equation (2).

$$f(\phi_{s0.bulk}) = \qquad \text{[Mathematical 27]}$$
$$\phi_{s0.bulk} - \left(\frac{1}{C_{BOX}} + \frac{1}{C_{SOI}}\right) \cdot Q_{bulk} + V_{bi.SOI} + V_{bs}$$

Then, $\phi_{s0.bulk}^{n+1}$ is given by $$\phi_{s0.bulk}^{n+1} = \phi_{s0.bulk}^{n} - \frac{f(\phi_{s0.bulk}^{n})}{f'(\phi_{s0.bulk}^{n})} \qquad \text{[Mathematical 28]}$$

<Derivation of Surface Potential $\phi_{s0.SOI}$ of SOI Layer>

Surface potential $\phi_{s0.SOI}$ of the SOI layer can be derived by using surface potential $\phi_{s0.bulk}$ of the bulk layer obtained by the Newton method described according to the following equation:

$$\phi_{b0.SOI} = \phi_{s0.bulk} - \frac{Q_{bulk}}{C_{BOX}} + V_{bi.SOI} + V_{bs} \qquad \text{[Mathematical 29]}$$

<Correction of Surface Potential $\phi_{s0.SOI}$ of SOI Layer When SOI Layer is Set in FD State>

When the depletion layer width $W_{d.SOI}$ of the SOI layer reaches the thickness $t_{SOI}$ of the SOI layer, the inversion of the surface of the SOI layer speeds up. After the SOI layer is set in the FD state, the charge $Q_{s0.bulk}$ induced in the bulk is negligibly smaller than the depletion charge "$-qN_{sub.SOI}(W_{d.SOI}-t_{SOI})$" which would have been generated had there been no BOX, and hence is neglected. The resultant structure is then expected to exhibit a potential change similar to that of the bulk-MOSFET having a depletion layer width fixed to the thickness $t_{SOI}$ of the SOI layer.

It is possible to keep the depletion layer width (=$t_{SOI}$) in the bulk-MOSFET constant by applying a bias "A" to the substrate as indicated by the following equation:

$$t_{SOI} = \sqrt{\frac{2\varepsilon_{Si}(\phi_{s0.SOI} - A)}{qN_{sub.SOI}}} \qquad \text{[Mathematical 30]}$$

Solving the above equation for A will yield the following equation:

$$A = \phi_{s0.SOI} - \frac{qN_{sub.SOI}}{2\varepsilon_{Si}}t_{SOI}^{2} \qquad \text{[Mathematical 31]}$$

The following equation is obtained when the initial solution $\phi_{s0.SOI\_iniA}$ of the surface potential of the SOI layer is re-solved assuming that the bias is applied to the substrate:

$$\phi_{s0.SOI\_iniA} = \qquad \text{[Mathematical 32]}$$
$$V_{gp} + \left(\frac{cnst0}{C_{FOX}}\right)^{2} \cdot \frac{\beta}{2}\left[1 - \sqrt{1 + \frac{4\{\beta(V_{gp} - A) - 1\}}{\beta^{2}\left(\frac{cnst0}{C_{FOX}}\right)^{2}}}\right]$$

where $V_{gp}$ is the value obtained by subtracting the flat band voltage from the gate-source voltage, $C_{FOX}$ is the capacitance of the gate oxide film, and cnst0 is given by the following equation.

$$cnst0 = \sqrt{\frac{2q\varepsilon_{Si}N_{sub.SOI}}{\beta}} \qquad \text{[Mathematical 33]}$$

It is possible to derive three initial solutions in the above manner.

The simulation apparatus performs simulation using the initial solutions obtained in the above manner and the analysis formulae.

[First Embodiment]

Figure 4:
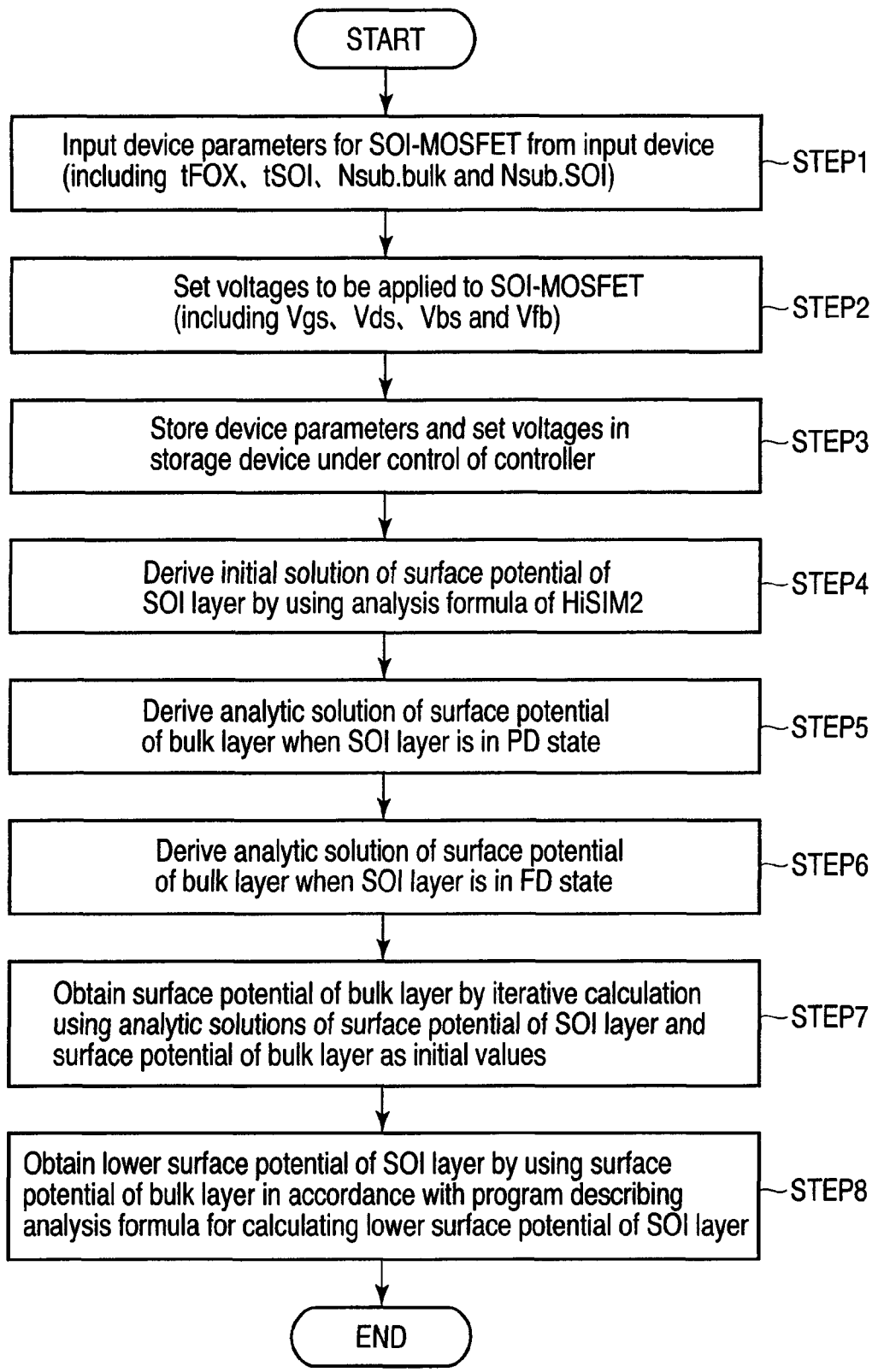
FIG. 4 is a flowchart showing a simulation method according to the first embodiment of the present invention.

A simulation method and simulation apparatus according to the first embodiment of the present invention using the above SOI-MOSFET model will be described with reference to FIGS. 3 and 4. FIG. 3 is a block diagram showing the schematic arrangement of the simulation apparatus according to an embodiment of the present invention. FIG. 4 is a flowchart showing the simulation method according to the embodiment of the present invention.

As shown in FIG. 3, the simulation apparatus includes an input device 21 including, for example, a keyboard, operation panel, and speech input device, or various types of data reading devices, a processor 22 to perform various kinds of processing, a storage device 23 including a semiconductor memory and hard disk, and an output device 24 including a monitor, printer, and recording device. The processor 22 includes a controller 22-1 such as a CPU and an arithmetic device 22-2 such as an ALU. The controller 22-1 controls the operations of the input device 21, arithmetic device 22-2, storage device 23, output device 24, and the like.

The above simulation apparatus may be implemented by a dedicated arrangement or by, for example, the corresponding devices of a personal computer.

The storage device 23 stores mathematical expressions, which are one type of expression of data representing the characteristics of a transistor, i.e., various kinds of arithmetic expressions, analysis formulae, and relational expressions in the above HiSIM-SOI model, described as programs. For example, the stored programs include a program describing an expression based on drift-diffusion approximation by a surface potential model, a program describing an arithmetic expression for calculating a potential at the source end of the SOI-MOSFET, a program describing an arithmetic expression for calculating a potential at the drain end of the SOI-MOSFET, a program describing an arithmetic expression for a drain-source current in the SOI-MOSFET, a program describing an analysis formula for calculating the surface potential of the SOI layer, a program describing an analysis formula for calculating the surface potential of the bulk layer, and a program describing an analysis formula for calculating the lower surface potential of the SOI layer. In addition, the storage device 23 stores device parameters, the initial values of parameters, and the like input from the input device 21 (or may store them in advance), and also stores the computation results obtained by the arithmetic device 22-2.

In the above arrangement, as shown in the flowchart of FIG. 4, first of all, this apparatus receives device parameters and model parameters for an SOI-MOSFET from the input device 21, including a gate oxide film thickness $t_{FOX}$, a thickness $t_{SOI}$ of the SOI layer, an impurity concentration $N_{sub.bulk}$ of the bulk, and an impurity concentration $N_{sub.SOI}$ of the SOI layer (STEP 1), and sets voltages to be applied to the SOI-MOSFET, including a gate-source voltage $V_{gs}$, a drain-source voltage $V_{ds}$, a bulk-source voltage $V_{bs}$, and a flat band voltage $V_{fb}$ (STEP 2).

The storage device 23 receives and stores the model parameters for the SOI-MOSFET, the gate-source voltage $V_{gs}$ in the SOI-MOSFET, the drain-source voltage $V_{ds}$, the bulk-source voltage $V_{bs}$, and the flat band voltage $V_{fb}$ which are input from the input device 21, under the control of the controller 22-1 in the processor 22 (STEP 3).

The model parameters for the SOI-MOSFET, a program describing an analysis formula for calculating a surface potential $\phi_{s0.SOI}$ of the SOI layer, a program describing an analysis formula for calculating a surface potential $\phi_{s0.bulk}$ of the bulk layer, and a program describing an analysis formula for calculating a lower surface potential $\phi_{b0.SOI}$ of the SOI layer, which are stored in the storage device 23, are transferred to the arithmetic device 22-2 under the control of the controller 22-1, thereby deriving initial solutions according to function expressions like those described in [Mathematical 1] to [Mathematical 33].

That is, the apparatus derives the initial solution of surface potential $\phi_{s0.SOI}$ of the SOI layer by using an analysis formula for HiSIM2 (STEP 4), derives the analytic solution of surface potential $\phi_{s0.bulk}$ of the bulk layer when the SOI layer is in the PD state (STEP 5), and derives the analytic solution of surface potential $\phi_{s0.bulk}$ of the bulk layer when the SOI layer is in the FD state (STEP 6). The initial solution and the analytic solutions are transferred to the storage device 23 and stored in it.

The apparatus obtains surface potential $\phi_{s0.bulk}$ of the bulk layer by iterative calculation using the analytic solution of surface potential $\phi_{s0.SOI}$ of the SOI layer obtained in STEP 4 and the analytic solution of surface potential $\phi_{s0.bulk}$ of the bulk layer obtained in STEP 5 and STEP 6 as initial values (STEP 7).

The apparatus then obtains the lower surface potential $\phi_{b0.SOI}$ of the SOI layer by an analysis formula using surface potential $\phi_{s0.bulk}$ of the bulk layer obtained in STEP 7 in accordance with the program which is stored in the storage device 23 and describes the analysis formula for calculating the lower surface potential $\phi_{b0.SOI}$ of the SOI layer (STEP 8).

The apparatus can extend the HiSIM into a model which can cover an SOI-MOSFET structure. The apparatus can stably and accurately simulate the device characteristics of the SOI-MOSFET.

[Second Embodiment]

A simulation method using an HiSIM-SOI described in the first embodiment can obtain a surface potential $\phi_{s0.SOI}$ (to be referred to as $\phi_1$ hereinafter) of the SOI layer, a lower surface potential $\phi_{b0.SOI}$ (to be referred to as $\phi_2$ hereinafter) of the SOI layer, and a surface potential $\phi_{s0.bulk}$ (to be referred to as $\phi_3$ hereinafter) of the bulk layer as initial solutions in the SOI-MOSFET structure.

The second embodiment described below is a method of simulating multiple variables accurately and quickly by the initial values of potentials $\phi_1$, $\phi_2$, and $\phi_3$ obtained in the above manner.

The simulation method according to the second embodiment will be described below with reference to FIG. 5. Note that this simulation is executed by a general-purpose computer system in the same manner as in the first embodiment.

First of all, as in the simulation shown in FIG. 4, this method receives device parameters and model parameters for the SOI-MOSFET, such as a gate oxide film thickness $t_{FOX}$, a thickness $t_{SOI}$ of the SOI layer, an impurity concentration $N_{sub.bulk}$ of the bulk, and an impurity concentration $N_{sub.SOI}$ of the SOI layer and potentials $\phi_1$, $\phi_2$, and $\phi_3$ as initial solutions from an input device 21, and causes a storage device 23 to store them (STEP 11 and STEP 12).

The method then receives mathematical expressions necessary for calculation, i.e., programs, from the predetermined input device 21 of the computer system, and stores them in the storage device 23. These programs are stored in an external storage device (for example, a hard disk) or the like as a predetermined storage device in a stored program computer system. These programs are loaded into a storage device (RAM or the like) for execution at the time of the execution of simulation. An arithmetic device (CPU or the like) sequentially or concurrently executes the programs (STEP 13).

The corresponding mathematical expressions will be described next.

Assume that surface potential $\phi_1$ of the SOI layer, the lower surface potential $\phi_2$ of the SOI layer, and surface potential $\phi_3$ of the bulk layer respectively hold the relationships represented by analysis formulae exemplified by Equations (A), (B), and (C) given below.

Obviously, Equations (A), (B), and (C) to be used are not limited to them, and these relationships can be expressed by other expressions or other analysis formulae.

[Mathematical 34]

$$f_1 = \phi_1 - V_{gp} - \frac{Q_{S0 \cdot bulk} + Q_n + Q_{dep \cdot SOI}}{C_{FOX}} \quad (A)$$

[Mathematical 35]

$$f_2 = \phi_2 - \phi_1 - \frac{Q_{S0 \cdot bulk} + \frac{1}{2}Q_{dep \cdot SOI}}{C_{SOI}} \quad (B)$$

[Mathematical 36]

$$f_3 = \phi_{s0 \cdot bulk} - \phi_{s0 \cdot SOI} - \frac{Q_{S0 \cdot bulk}}{C_{BOX}} \quad (C)$$

In these equations, $V_{gp}$ is the value obtained by subtracting the flat band voltage from the gate-source voltage, $Q_{s0.bulk}$ is the charge quantity of the bulk, $Q_n$ is the inversion charge quantity of the SOI surface, $Q_{dep.SOI}$ is the depletion charge quantity of the SOI layer, $C_{BOX}$ is the charge capacitance of the BOX, $C_{FOX}$ is the charge capacitance of the gate oxide film, $C_{SOI}$ is given by $\epsilon_{si}/t_{SOI}$, $\epsilon_{si}$ is the dielectric constant of silicon, and $t_{SOI}$ is the thickness of the SOI layer.

Surface potential $\phi_1$ of the SOI layer, the lower surface potential $\phi_2$ of the SOI layer, and surface potential $\phi_3$ of the bulk layer need only be determined to make $f_1$, $f_2$, and $f_3$ of analysis formulae (A), (B), and (C) simultaneously become zero. This amounts to obtaining the solutions of simultaneous equations with three variables. In the process of obtaining these solutions using the computer, it is necessary to perform iterative calculation for three variables using the Newton method.

This method then executes STEP 14. Iterative calculation for three variables is nothing but performing iterative calculation for correction difference amounts $\delta\phi=(\delta\phi_1, \delta\phi_2, \delta\phi_3)T$ (where T represents transposition) by Equation (E) using Jacobian matrix J (Equation (D)).

[Mathematical 37]

$$J = \begin{vmatrix} \frac{\partial f_1}{\partial \phi_1} & \frac{\partial f_1}{\partial \phi_2} & \frac{\partial f_1}{\partial \phi_3} \\ \frac{\partial f_2}{\partial \phi_1} & \frac{\partial f_2}{\partial \phi_2} & \frac{\partial f_2}{\partial \phi_3} \\ \frac{\partial f_3}{\partial \phi_1} & \frac{\partial f_3}{\partial \phi_2} & \frac{\partial f_3}{\partial \phi_3} \end{vmatrix} \quad (D)$$

[Mathematical 38]

$$\begin{pmatrix} \delta\phi_1 \\ \delta\phi_2 \\ \delta\phi_3 \end{pmatrix} = -J^{-1} \begin{pmatrix} f_1 \\ f_2 \\ f_3 \end{pmatrix} \quad (E)$$

In STEP 14, the method receives Equation (E) as a program for iterative calculation with three variables from a predetermined input device of the computer system, and causes the storage device to store the program.

The method then receives the initial values of surface potential $\phi_1$ of the SOI layer, the lower surface potential $\phi_2$ of the SOI layer, and surface potential $\phi_3$ of the bulk layer from a predetermined input device of the computer system, and causes the storage device to store them. These data are stored in an external storage device or the like as a predetermined storage device in a stored program computer system. The data are loaded into a storage device for execution, such as a RAM, at the time of execution.

The processing order of STEP 11 and STEP 12 is not specifically limited. It is possible to execute STEP 11 after STEP 12.

(Step 15 and Step 16)

In STEP 11 to STEP 14, the external storage device or the like stores the program for iterative calculation and the initial values at the time of the execution of the program. It is therefore possible to load them into the RAM or the like at an arbitrary timing and make the CPU or the like sequentially or concurrently execute them. A condition for the end of the execution is that the correction difference amount $\delta\phi$ reaches a predetermined threshold in the process of calculation. When the correction difference amount $\delta\phi$ does not reach the threshold, control shifts to STEP 13 to repeat the above operation.

With the above operation, based on surface potential $\phi_1$ of the SOI layer, the lower surface potential $\phi_2$ of the SOI layer, and surface potential $\phi_3$ of the bulk layer, which are acquired as initial values, it is possible to obtain surface potential $\phi_1$ of the SOI layer, the lower surface potential $\phi_2$ of the SOI layer, and surface potential $\phi_3$ of the bulk layer, which are solutions of iterative calculation and are higher in accuracy.

The values of potentials $\phi_1$, $\phi_2$, and $\phi_3$ obtained by the above processing do not fall to extreme values in iterative calculation. This is because the initial values of them are considerably high in accuracy.

(Step 17)

In STEP 14 described above, when the correction difference amount $\delta\phi$ reaches the threshold, device characteristics of the SOI-MOSFET, e.g., a current and a capacitance, are obtained based on potentials $\phi_1$, $\phi_2$, and $\phi_3$ (solutions of iterative calculation). Device characteristics include currents and capacitances between the gate, source, and drain terminals of the MOSFET and currents and capacitances between the terminals and the bulk.

Introducing the Jacobian matrix J (Equation (D)) allows to simultaneously and quickly execute iterative calculation of multiple variables (although three variables will be exemplified, the number of variables is not limited to this) by using the computer. This makes it possible to achieve both high accuracy and high speed in computer simulation.

According to the second embodiment, therefore, it is possible to accurately and quickly simulate multiple variables by using the potentials obtained in the first embodiment as initial values.

FIG. 6 is a graph showing the relationship between the surface potential of the SOI layer, the rear surface potential of the SOI layer, and the surface potential of the bulk layer and the gate-source voltage in a two-dimensional device simulator (2D-Device) model. This graph shows the result obtained by simulation using a two-dimensional device simulator MEDICI.

Figure 8:
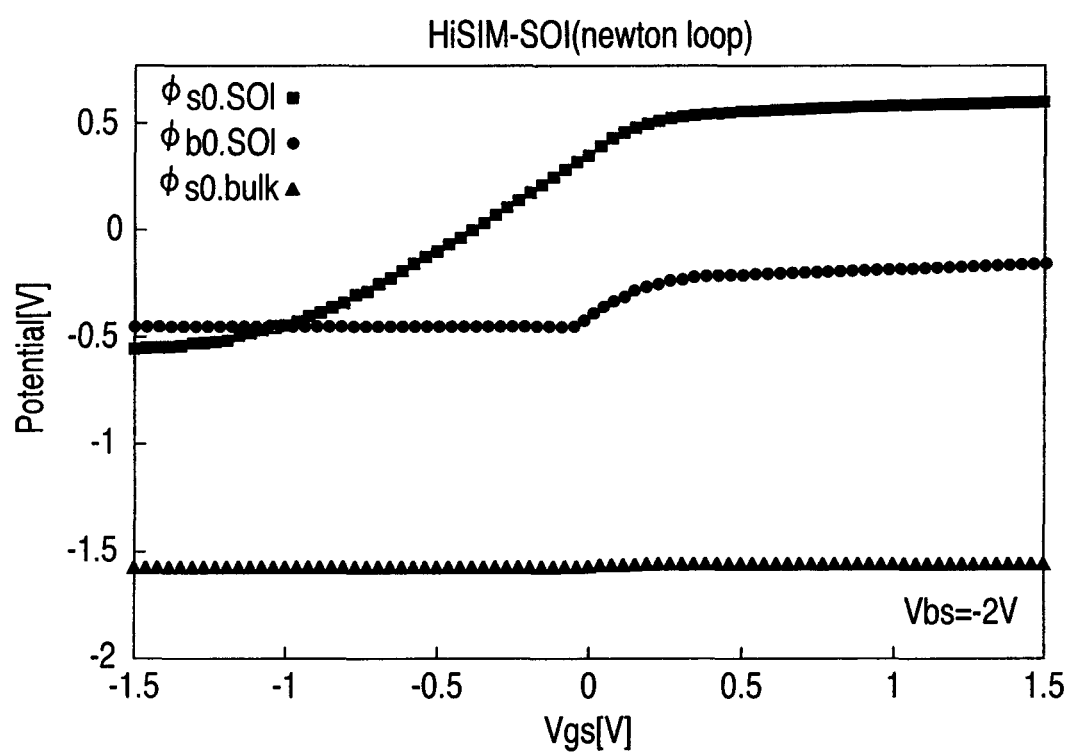
FIG. 8 is a graph showing the relationship between the surface potential of the SOI layer, the rear surface potential of the SOI layer, and the surface potential of the bulk layer and the gate-source voltage in an HiSIM-SOI (Newton loop) model.

FIG. 7 is a graph showing the relationship between the surface potential of the SOI layer, the rear surface potential of the SOI layer, and the surface potential of the bulk layer and the gate-source voltage in an HiSIM-SOI (initial value) model. FIG. 8 is a graph showing the relationship between the surface potential of the SOI layer, the rear surface potential of the SOI layer, and the surface potential of the bulk layer and the gate-source voltage in an HiSIM-SOI (Newton loop) model. FIGS. 6, 7, and 8 show the simulation results obtained when the bulk-source voltage $V_{bs}$ is −2 V.

Figure 9:
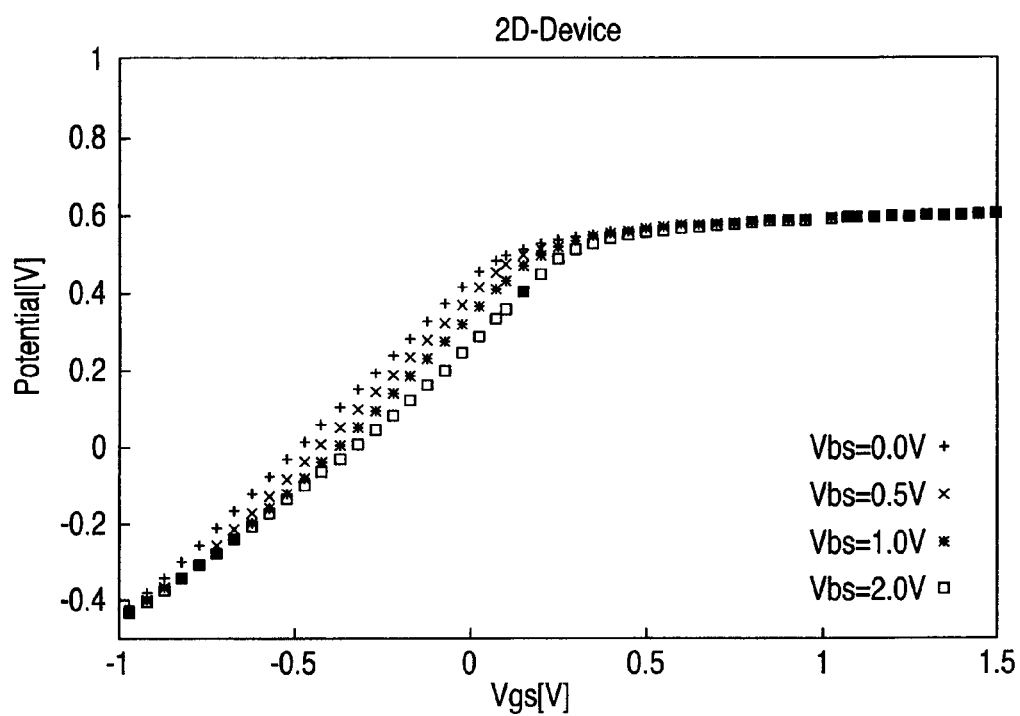
FIG. 9 is a graph showing the relationship between the surface potential of the SOI layer, the rear surface potential of the SOI layer, and the surface potential of the bulk layer and the gate-source voltage in a two-dimensional device simulator model when the bulk-source voltage changes.
Figure 10:
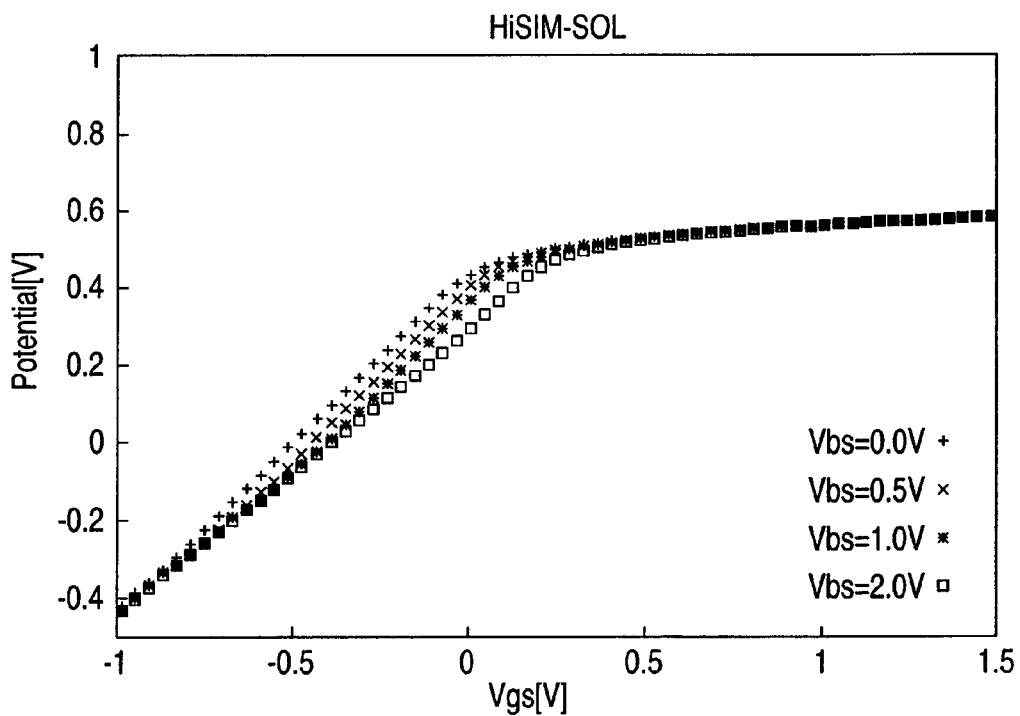
FIG. 10 is a graph showing the relationship between the surface potential of the SOI layer, the rear surface potential of the SOI layer, and the surface potential of the bulk layer and the gate-source voltage in an HiSIM-SOI model when the bulk-source voltage changes.

FIG. 9 is a graph showing the relationship between the surface potential of the SOI layer and the gate-source voltage in the two-dimensional device simulator (2D-Device) model when the bulk-source voltage changes. FIG. 10 is a graph showing the relationship between the surface potential of the SOI layer and the gate-source voltage in an HiSIM-SOI model when the bulk-source voltage changes. In FIGS. 9 and 10, the bulk-source voltage $V_{bs}$ is set to 0.0, −0.5, −1.0, and −2.0 V.

That is, the HiSIM-SOI has the following advantages and effects relative to the 2D model. A 2D device simulator partitions a device structure into meshes, and simultaneously sets up Poisson equations and current continuity equations for each node to numerically solve them. This inevitably increases the amount of calculation. In addition, some limitation is imposed on the number of nodes which the computer can process. For this reason, the 2D device simulator cannot simulate large-scale circuits, and hence is limited to circuit simulation corresponding to nearly several transistors. Furthermore, this simulator numerically solves many simultaneous equations, and hence takes a long calculation time.

In contrast, the HiSIM-SOI obtains device characteristics with analysis formulae without partitioning the device into meshes, and hence is much smaller in calculation amount than the 2D device simulator. For this reason, the HiSIM-SOI can simulate a large-scale circuit within a desired processing time in terms of execution. Furthermore, the HiSIM-SOI is overwhelmingly shorter in calculation time per device than the 2D device simulator.

Therefore, the simulation apparatus having the above arrangement and the above simulation method can stably and accurately simulate the device characteristics of an SOI-MOSFET. In addition, a model has been developed by using the structure parameters of a MOSFET, and hence the apparatus and method can easily cope with differences in structure.

It is therefore possible to design and manufacture SOI-MOSFETs by adjusting various device parameters and set voltages in MOSFETs so as to reflect these MOSFET models and simulation results in device design.

[Third Embodiment]

The present invention causes an input device 21 to input circuit diagrams and circuit driving conditions, in addition to device parameters, and causes a storage device 23 to store them, thereby obtaining circuit characteristics by using the data stored in the storage device 23.

FIG. 11 shows the third embodiment and a method of obtaining circuit characteristics.

As shown in FIG. 11, first of all, this method receives device parameters, a circuit diagram, and circuit driving conditions from the input device 21, and causes the 23 to store them (STEP 21). This operation is performed by a circuit simulation program (circuit simulator) stored in the storage device 23.

The circuit simulation program then inputs the device parameters and applied voltages to a program (HiSIM-SOI) for simulating the device characteristics of the SOI-MOSFET (STEP 22).

Figure 5:
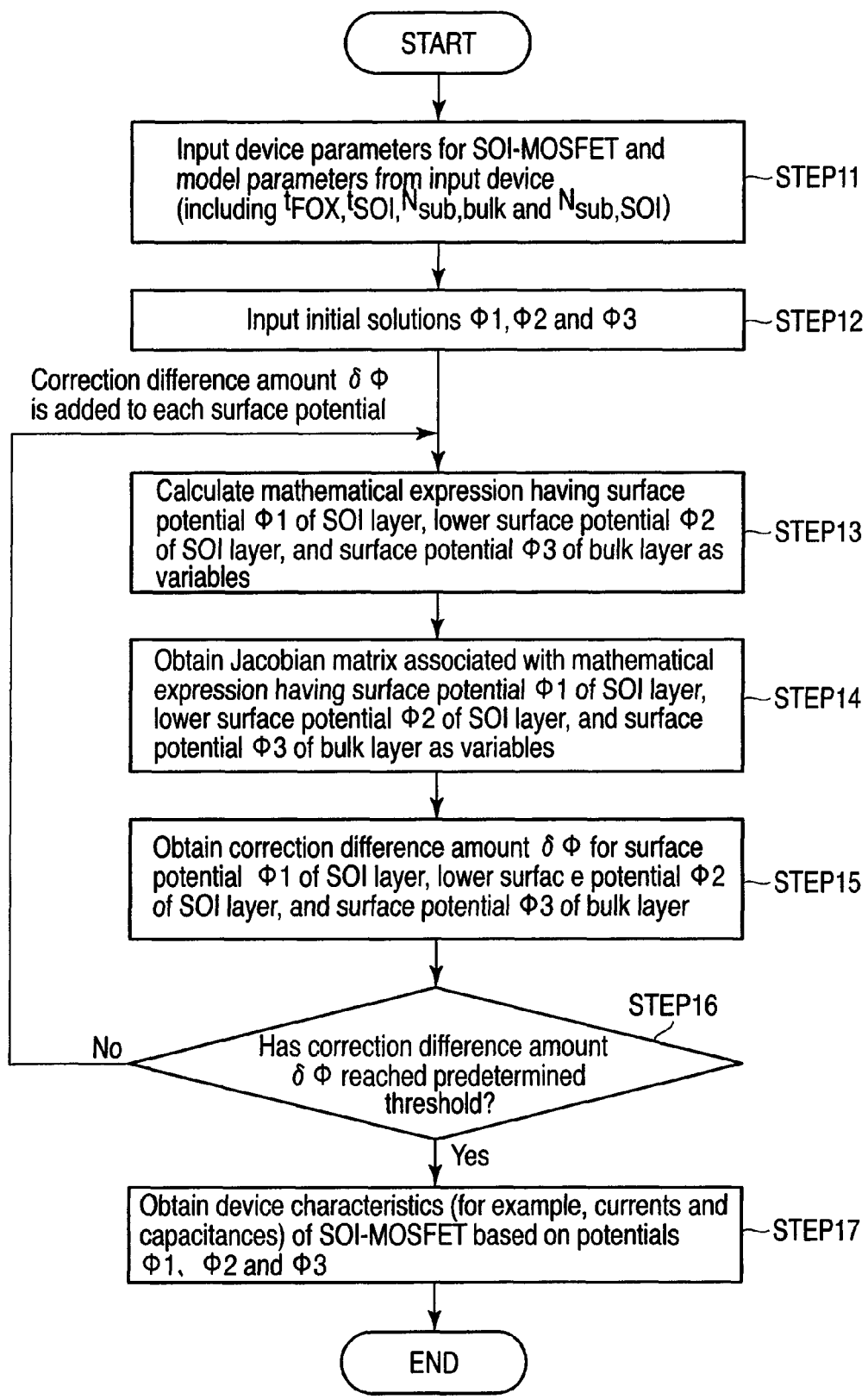
FIG. 5 is a flowchart showing a simulation method according to the second embodiment of the present invention.

Thereafter, this method executes computation in accordance with the flowcharts shown in FIGS. 4 and 5 to obtain device characteristics (STEP 23).

The device characteristics obtained in STEP 23 are supplied to the circuit simulation program (STEP 24).

The circuit simulation program simulates circuit characteristics based on the supplied device characteristics (STEP 25).

The following is the concrete operation of the apparatus shown in FIG. 3 which is associated with the simulation of the above circuit characteristics. A controller 22-1 controls the input device 21, an arithmetic device 22-2, an output device 24, and the storage device 23. The storage device 23 stores a program describing instructions for controlling the arithmetic device 22-2 and the device parameters, circuit diagram, and circuit driving conditions input from the input device 21. The arithmetic device 22-2 simulates the circuit characteristics in accordance with the programs stored in the storage device 23 based on the device parameters and the data of the circuit diagram and circuit driving conditions. The output device 24 outputs the circuit characteristics computed by the arithmetic device 22-2.

The third embodiment can simulate circuit characteristics by inputting device parameters, a circuit diagram, and circuit driving conditions, and using a program (HiSIM-SOI) for simulating the device characteristics of the SOI-MOSFET and a circuit simulation program. It is therefore possible to accurately and quickly simulate circuit characteristics.

[Fourth Embodiment]

The present invention can specify device parameters by changing device parameters to be input in accordance with a predetermined algorithm and finishing calculation when device characteristics as calculation results coincide with required device characteristics.

Figure 12:
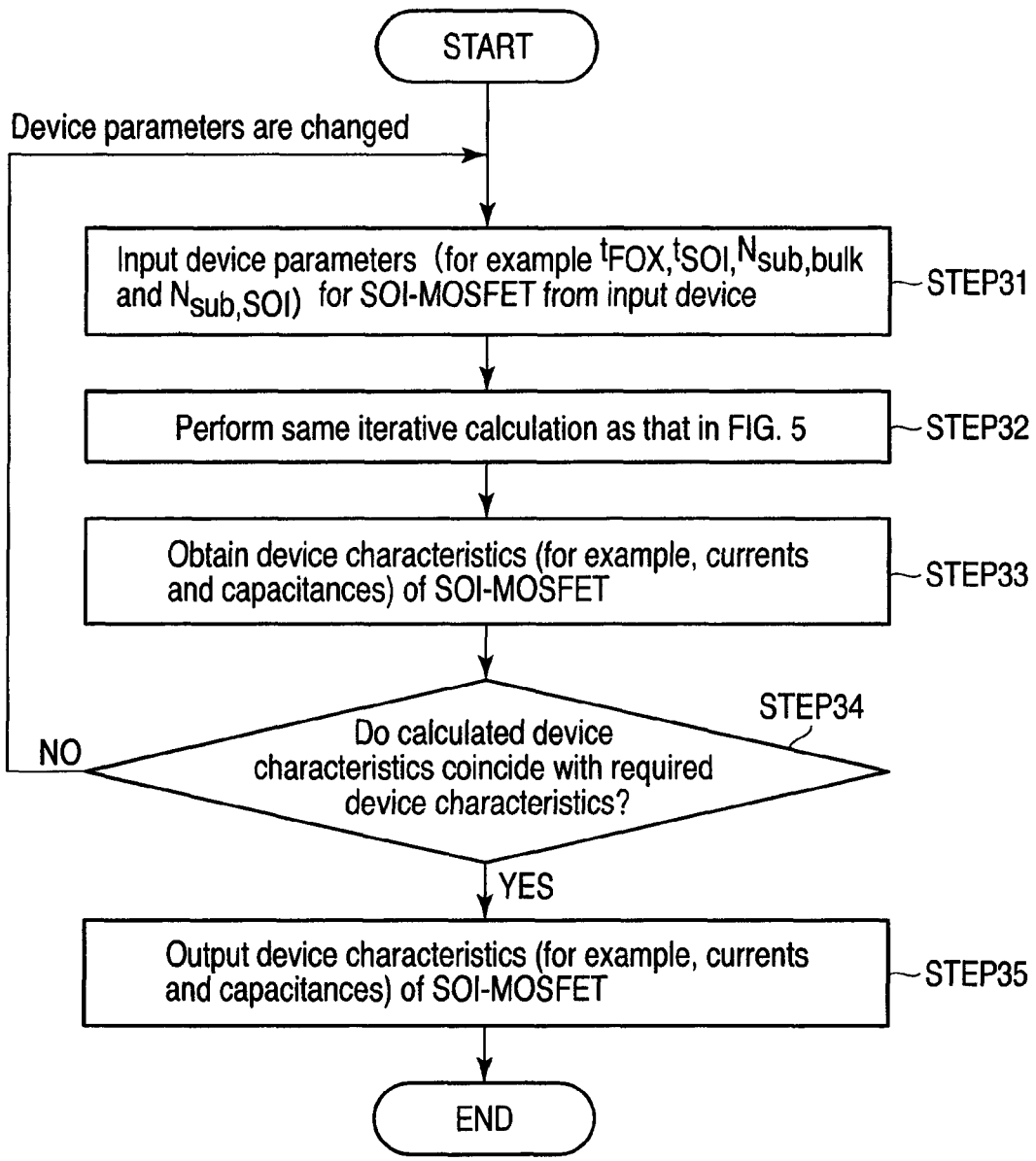
FIG. 12 is a flowchart showing the fourth embodiment, which is a modification of the method in FIG. 5.

FIG. 12 shows the fourth embodiment and a method of specifying device parameters.

As shown in FIG. 12, first of all, this method receives device parameters for an SOI-MOSFET from an input device 21, including, for example, a gate oxide film thickness $t_{FOX}$, a thickness $t_{SOI}$ of the SOI layer, an impurity concentration $N_{sub.bulk}$ of the bulk, and an impurity concentration $N_{sub.SOI}$ of the SOI layer, and causes a storage device 23 to store them (STEP 31).

Thereafter, the method calculates potentials $\phi_1$, $\phi_2$, and $\phi_3$ in accordance with the flowchart shown in FIG. 5 (STEP 32), and calculates the device characteristics of the SOI-MOSFET, e.g., currents and capacitances between terminals (STEP 33).

The method then determines whether the calculated device characteristics coincide with required device characteristics (STEP 34). Upon determining as a result of this determination that they do not coincide with each other, the method changes the device parameters and repeats the processing in STEP 31 to STEP 33. When changing the device parameters, the method changes, for example, the gate oxide film thickness, the thickness of the SOI layer, the impurity concentration of the bulk, and the impurity concentration of the SOI layer.

If the calculated device characteristics coincide with the required device characteristics, the method finishes the above calculation processing (STEP 35). This makes it possible to obtain device parameters corresponding to the required device characteristics.

The fourth embodiment calculates the accurate values of potentials $\phi_1$, $\phi_2$, and $\phi_3$ by changing the device parameters, calculates the device characteristics of the SOI-MOSFET based on the calculated potentials $\phi_1$, $\phi_2$, and $\phi_3$, and compares the calculated device characteristics with the required device characteristics. This makes it possible to obtain device parameters for the SOI-MOSFET which coincide with the required device characteristics.

As described above, according to one aspect of the present invention, a simulation method and simulation apparatus which can stably and accurately simulate the device characteristics of an SOI-MOSFET can be obtained.

Since the device structure of the SOI-MOSFET has a high degree of freedom, it is possible to determine a structure from simulation based on the present invention and to evaluate circuit characteristics. This can reduce the cost of development. In addition, SOI-MOSFETs are in high demand, and the present invention can cope with a variety of applications.

The present invention is not limited to the first to fourth embodiments, and can be variously modified within the spirit and scope of the invention. For example, each embodiment described above has exemplified the simulation method and simulation apparatus used for only an SOI-MOSFET model. However, since the basic part of a bulk-MOSFET model is common to that of an SOI-MOSFET model, it is possible to cope with both a bulk-MOSFET and an SOI-MOSFET by, for example, setting a flag for the calculation of potentials only for the SOI-MOSFET and switching the flag. Therefore, it is possible to simulate a circuit including both a bulk-MOSFET and an SOI-MOSFET.

The first to fourth embodiments include inventions of various stages, and various inventions can be extracted by proper combinations of a plurality of disclosed constituent elements. When, for example, at least one of the problems described in "Background Art" can be solved and at least one of the effects described in "Disclosure of Invention" can be obtained even if several constituent elements are omitted from all the constituent elements in the first to fourth embodiments, the arrangement from which these constituent elements are omitted can be extracted as an invention.

The present invention can be applied to the device design of an SOI-MOSFET, the simulation of a circuit using an SOI-MOSFET, and the like.

What is claimed is:

1. A simulation method of simulating device characteristics of a transistor in which a source region and a drain region are isolated and formed in a silicon layer on a buried oxide film, and a gate electrode is formed on a gate insulating film on a channel region between the source region and the drain region, comprising the steps of:

inputting a mathematical expression as one form of expression of data representing a characteristic of the transistor using an input device and causing a storage device to store the mathematical expression;

inputting a device parameter for the transistor from the input device and causing the storage device to store the device parameter;

calculating a first value of a surface potential of the silicon layer by performing computation using an arithmetic device based on the mathematical expression and the device parameter stored in the storage device;

calculating a first value of a surface potential of a bulk layer under the buried oxide film when the silicon layer is in a partially depleted state and when the bulk layer is in a depleted state, calculating a second value of a surface potential of the bulk layer when the silicon layer is in the partially depleted state and when the hulk layer is in an inverted state, calculating a third value of a surface potential of the bulk layer when the silicon layer is in a fully depleted state and when the bulk layer is in the depleted state, and calculating a fourth value of a surface potential of the bulk layer when the silicon layer is in the fully depleted state and when the bulk layer is in the inverted state, by causing the arithmetic device to perform computation based on the mathematical expression and the device parameter stored in the storage device;

causing the arithmetic device to perform computation based on the calculated first value of the surface potential of the silicon layer, at least one of the calculated first to fourth values of the surface potential of the bulk layer, and the mathematical expression stored in the storage device, and obtaining a fifth value of the surface potential of the bulk layer by iterative calculation; and calculating a first value of a lower surface potential of the silicon layer by causing the arithmetic device to perform computation based on the fifth value of the surface potential of the bulk layer obtained by the iterative calculation and the mathematical expression stored in the storage device.

2. The simulation method according to claim 1, further comprising the steps of:

inputting, from the input device, a first mathematical expression, a second mathematical expression, and a third mathematical expression which are different from each other, are one form of expression of data representing characteristics of the transistor, and describe a relationship between the surface potential of the silicon layer, the surface potential of the bulk layer, and the lower surface potential of the silicon layer, and causing the storage device to store the first mathematical expression, the second mathematical expression, and the third mathematical expression;

causing the storage device to store the first value of the surface potential of the silicon layer, the fifth value of the surface potential of the bulk layer, and the first value of the lower surface potential of the silicon layer; and calculating a second value of the surface potential of the silicon layer, a sixth value of the surface potential of the bulk layer, and a second value of the lower surface potential of the silicon layer by causing the arithmetic device to perform iterative calculation based on the first mathematical expression, the second mathematical expression, and the third mathematical expression different from each other, the first value of the surface potential of the silicon layer, the fifth value of the surface potential of the bulk layer, and the first value of the lower surface potential of the silicon layer, which are stored in the storage device.

3. The simulation method according to claim 2, wherein the iterative calculation is performed in an iterative calculation step by the arithmetic device using the first mathematical expression, the second mathematical expression, and the third mathematical expression different from each other as a mathematical expression of a Jacobian matrix.

4. The simulation method according to claim 1, wherein the first value of the surface potential of the silicon layer is calculated by using a bulk-MOSFET model based on the surface potential.

5. The simulation method according to claim 1, wherein the iterative calculation comprises a one-variable Newton method.

6. The simulation method according to claim 1, further comprising the steps of:

causing the storage device to store a program describing instructions for controlling a controller to control the input device, the storage device, and the arithmetic device; and inputting a device parameter, a circuit diagram, and a circuit driving condition from the input device and causing the storage device to store the device parameter, the circuit diagram, and the circuit driving condition, wherein a circuit characteristic is simulated by causing the arithmetic device to compute according to a program stored in the storage device based on a model parameter calculated by the arithmetic device, a circuit diagram, and a circuit driving condition under the control of the controller.

7. A simulation apparatus simulating a device characteristic of a transistor by executing each step in a simulation method defined in claim 1 or 2.

8. The simulation apparatus according to claim 7, further comprising a controller configured to control the input device, the storage device, and the arithmetic device, and an output device configured to output a model parameter obtained by computation by the arithmetic device.

9. The simulation apparatus according to claim 8, wherein the storage device stores a program describing instructions for controlling the controller and a device parameter, a circuit diagram, and a circuit driving condition which are input from the input device, and a circuit characteristic is simulated by causing the arithmetic device to perform computation according to the program based on the device parameter, the circuit diagram, and the circuit driving condition under the control of the controller.

10. The simulation method according to claim 2, comprising the steps of:

inputting a device parameter for an SOI-MOSFET from the input device and causing the storage device to store the device parameter;

causing the arithmetic device to calculate a device characteristic based on the second value of the surface potential of the silicon layer, the sixth value of the surface potential of the bulk layer, and the second value of the lower surface potential of the silicon layer which are obtained in claim 2; and causing a controller to determine whether the calculated device characteristic coincides with a required device characteristic, the controller controlling the arithmetic device, wherein when the controller determines that the calculated device characteristic does not coincide with the required device characteristic, the controller repeats the step of changing the device parameter and performing the calculation again, whereas when the controller determines that the calculated device characteristic coincides with the required device characteristic, the controller finishes the step of performing calculation.

11. The simulation method according to claim 1, comprising the steps of:

calculating a first correction difference amount of the surface potential of the silicon layer, a second correction difference amount of the lower surface potential of the silicon layer and a third correction difference amount of the surface potential of the bulk layer by causing the arithmetic device to perform computation based on the first value of the surface potential of the silicon layer, the first value of the lower surface potential of the silicon layer and the fifth value of the surface potential of the bulk layer;

calculating a fourth correction difference amount of the surface potential of the silicon layer, a fifth correction difference amount of the lower surface potential of the silicon layer and a sixth correction difference amount of the surface potential of the bulk layer by causing the arithmetic device to perform computation based on the first value of the surface potential of the silicon layer including the first correction different amount, the first value of the lower surface potential of the silicon layer including the second correction different amount and the fifth value of the surface potential of the bulk layer including the third correction different amount when the first to third correction difference amounts do not reach predetermined threshold values, respectively.

12. The simulation method according to claim 1, wherein in a determination whether the silicon layer is in the fully depleted state or the partially depleted state, the silicon layer is determined to be in the fully depleted state when a depletion layer width of the silicon layer is equal to or larger than a thickness of the silicon layer is determined by the arithmetic device, the silicon layer is determined to be in the partially depleted state when a depletion layer width of the silicon layer is smaller than a thickness of the silicon layer is determined by the arithmetic device.

* * * * *